(12) United States Patent
Makihara et al.

(10) Patent No.: US 7,829,935 B2
(45) Date of Patent: Nov. 9, 2010

(54) SEMICONDUCTOR MEMORY, SEMICONDUCTOR MEMORY SYSTEM USING THE MEMORY, AND METHOD FOR MANUFACTURING QUANTUM DOT USED IN SEMICONDUCTOR MEMORY

(75) Inventors: Katsunori Makihara, Higashihiroshima (JP); Seiichi Miyazaki, Higashihiroshima (JP); Seiichiro Higashi, Higashihiroshima (JP)

(73) Assignee: Hiroshima University, Higashihiroshima, Hiroshima (JP)

( * ) Notice: Subject to any disclaimer, the term of this patent is extended or adjusted under 35 U.S.C. 154(b) by 0 days.

(21) Appl. No.: 12/600,986

(22) PCT Filed: Mar. 26, 2008

(86) PCT No.: PCT/JP2008/000740

§ 371 (c)(1),
(2), (4) Date: Nov. 19, 2009

(87) PCT Pub. No.: WO2009/118783

PCT Pub. Date: Oct. 1, 2009

(65) Prior Publication Data
US 2010/0155808 A1 Jun. 24, 2010

(51) Int. Cl.
*H01L 21/336* (2006.01)
*H01L 29/788* (2006.01)

(52) U.S. Cl. ............... 257/321; 257/324; 257/E21.209; 257/E21.21; 257/E21.114; 257/E21.423; 257/E29.301; 438/257; 438/261; 438/264; 438/584

(58) Field of Classification Search ............ 257/321, 257/324, E21.209, E21.21, E21.114, E21.423, 257/E29.301; 438/257, 261, 264, 584
See application file for complete search history.

(56) References Cited

U.S. PATENT DOCUMENTS 6,946,346 B2 * 9/2005 Chae et al. ............... 438/257
7,105,425 B1 * 9/2006 Krivokapic .............. 438/481
2009/0173934 A1 * 7/2009 Jain ........................ 257/20

FOREIGN PATENT DOCUMENTS

| JP | 09-260611 | 10/1997 |
| JP | 11-40809 | 2/1999 |
| JP | 2000-40753 | 2/2000 |
| JP | 2000-150862 | 5/2000 |

(Continued)

OTHER PUBLICATIONS

JP2003-078050, Oba Ryuji et al. Mar. 14, 2003, English translation.*

(Continued)

*Primary Examiner*—Dao H Nguyen
(74) *Attorney, Agent, or Firm*—Foley & Lardner LLP

(57) ABSTRACT

A semiconductor memory has a composite floating structure in which quantum dots composed of Si and coated with a Si oxide thin film are deposited on an insulating film formed on a semiconductor substrate, quantum dots coated with a high-dielectric insulating film are deposited on the quantum dots, and quantum dots composed of Si and coated with a high-dielectric insulating film are further deposited. Each of the quantum dots includes a core layer and a clad layer which covers the core layer. The electron occupied level in the core layer is lower than that in the clad layer.

14 Claims, 9 Drawing Sheets

FOREIGN PATENT DOCUMENTS

| | | |
|---|---|---|
| JP | 2000-164735 | 6/2000 |
| JP | 2003-78050 | 3/2003 |
| JP | 2003-347434 | 12/2003 |
| JP | 2004-259986 | 9/2004 |
| JP | 2005-277263 | 10/2005 |
| JP | 2006-32564 | 2/2006 |
| JP | 2007-73969 | 3/2007 |
| WO | WO 2005/036599 | 4/2005 |

OTHER PUBLICATIONS

Darma et al., Influence of thermal annealing on compositional mixing and crystallinity of highly selective grown Si dots with Ge core, Applied Surface Science, 2004, pp. 156-159, vol. 224.

Lee et al., Theoretical and Experimental Investigation of Si Nanocrystal Memory Device with $HfO_2$ High-k Tunneling Dielectric, 2003 Symposium on VLSI Technology Digest of Technical Papers, 2 pages.

Makihara et al., Characterization of Electronic Charged States of Impurity doped Si Quantum Dots Using AFM/Kelvin Probe Technique, Abstract of IUMRS-ICA-2006, Sep. 2006, p. 82, Jeju, Korea.

Makihara et al., Fabrication of Multiply-Stacked Structures of Si Quantum Dots Embedded in $SiO_2$ by Combination of Low-Pressure CVD and Remote Plasma Treatments, 2004 International Microprocesses and Nanotechnology Conference, Digest of Papers, Oct. 27, 2004, pp. 216-217.

Ohba et al., Nonvolatile Si Quantum Memory With Self-Aligned Doubly-Stacked Dots, IEEE Transactions on Electron Devices, Aug. 2002, pp. 1392-1398, vol. 49, No. 8.

International Search Report of International Application No. PCT/JP2008/000740 and English Translation of the same, mail date Jun. 17, 2008, 4 pages.

\* cited by examiner

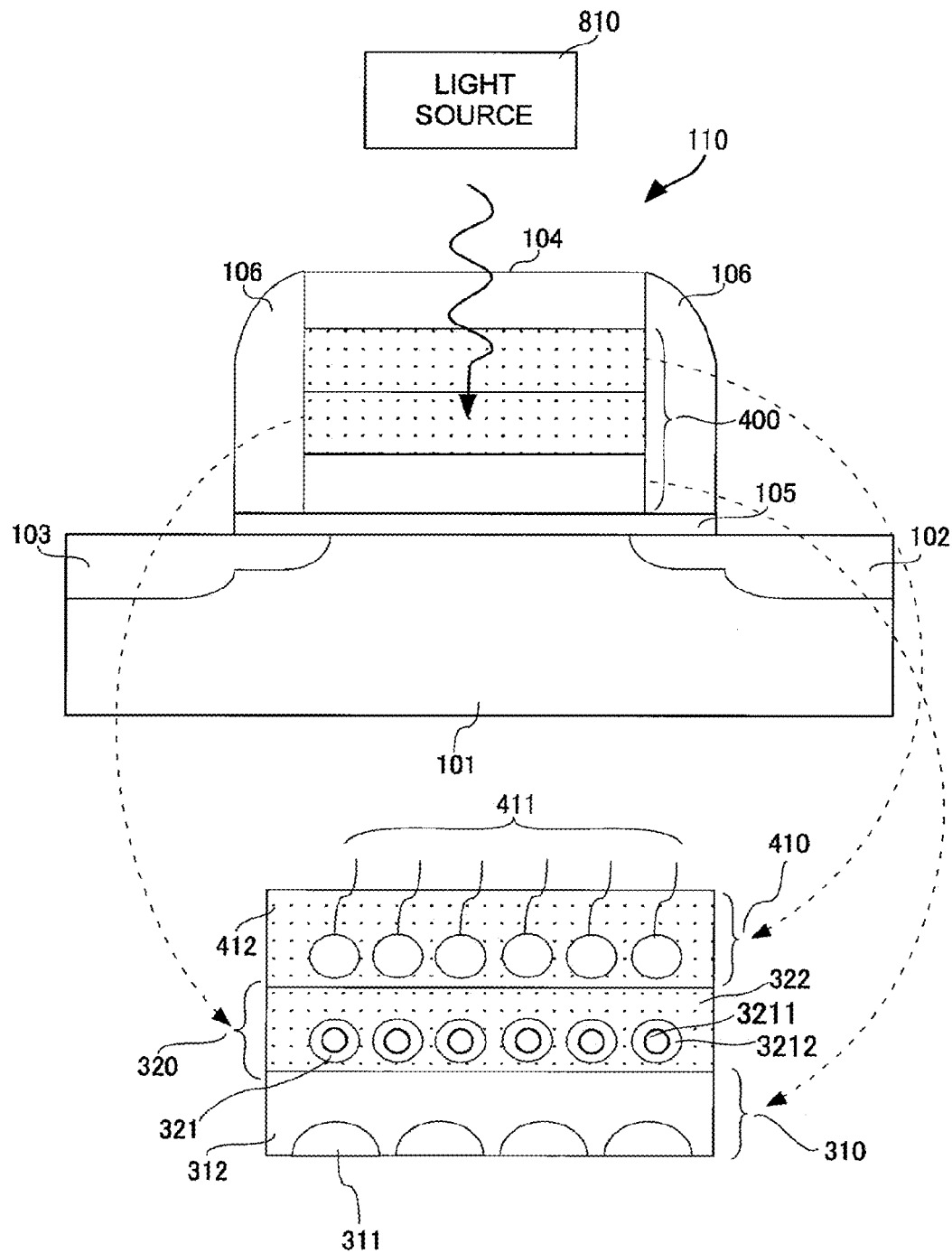

SEMICONDUCTOR MEMORY, SEMICONDUCTOR MEMORY SYSTEM USING THE MEMORY, AND METHOD FOR MANUFACTURING QUANTUM DOT USED IN SEMICONDUCTOR MEMORY

CROSS-REFERENCE TO RELATED PATENT APPLICATIONS

The present application claims priority as a national stage application of the International Application No. PCT/JP2008/000740 filed on Mar. 26, 2008, the entire contents of which are incorporate herein by reference in their entireties.

TECHNICAL FIELD

The present invention relates to a semiconductor memory, a semiconductor memory system using the memory, and a method for manufacturing quantum dots used in a semiconductor memory. In particular, the present invention relates to a semiconductor memory including a composite floating gate structure, a semiconductor memory system using the memory, and a method for manufacturing quantum dots used in a semiconductor memory.

BACKGROUND ART

Light-emitting elements using quantum dots have been known (Japanese Unexamined Patent Application Publication No. 2006-32564).

The light-emitting elements are MOS (Metal Oxide Semiconductor) field effect transistor-type light-emitting elements and include quantum dots disposed between a gate oxide film and a gate electrode.

The quantum dots have a structure in which a germanium (Ge) core is contained in a silicon (Si) cluster.

The light-emitting elements emit light by recombination of electrons in Si cluster with holes of Ge core of quantum dots.

DISCLOSURE OF INVENTION

However, the quantum dots disclosed in Japanese Unexamined Patent Application Publication No. 2006-32564 have difficulty in confining electrons in the quantum dots because the conduction band edges of Ge core are energetically higher than the conduction band edges of Si cluster. Consequently, a semiconductor memory using the quantum dots has the problem of degrading information holding properties.

Accordingly, the present invention has been achieved for resolving the problem, and an object of the present invention is to provide a semiconductor memory including a composite floating gate structure capable of improving information holding properties.

Another object of the present invention is to provide a semiconductor memory system using a semiconductor memory including a composite floating gate structure capable of improving information holding properties.

A further object of the present invention is to provide a method for manufacturing quantum dots used in a semiconductor memory including a composite floating gate structure capable of improving information holding properties.

According to the present invention, a semiconductor memory has a floating gate structure and includes a charge storage node and a control node. The charge storage node includes first quantum dots and stores electrons. The control node includes second quantum dots and injects and/or emits electrons to the charge storage node. The first quantum dots each include a core layer and a clad layer which covers the core layer. The electron occupied level in the core layer is lower than that in the clad layer.

Preferably, the control node includes first and second control nodes, and the charge storage node is laminated between the first and second control nodes.

Preferably, the charge storage node includes the first quantum dots and a first coating material which covers the first quantum dots. The control node includes the second quantum dots and a second coating material which covers the second quantum dots. Each of the first quantum dots is composed of a material different from that of the second quantum dots. The first coating material is different from the second coating material.

Preferably, the core layers of the first quantum dots are composed of a compound of a metal and a semiconductor. The clad layers of the first quantum dots are composed of a semiconductor. The second quantum dots are composed of metal silicide.

Preferably, the core layers are composed of a metal silicide of silicon and a metal. The clad layers are composed of silicon.

Preferably, the metal is nickel or tungsten.

Preferably, the core layers are composed of a compound of germanium and a metal. The clad layers are composed of germanium.

Preferably, the metal is nickel or tungsten.

According to the present invention, a semiconductor memory system includes a semiconductor memory and a light source. The semiconductor memory has a floating gate structure, and the light source irradiates to the semiconductor memory with light. The semiconductor memory includes a floating gate and a gate electrode. The floating gate includes a charge storage node which includes first quantum dots and stores electrons and a control node which includes second quantum dots and injects and/or emits electrons to the charge storage node. The gate electrode leads light emitted from the light source to the charge storage node. The first quantum dots each include a core layer and a clad layer which covers the core layer. The electron occupied level in the core layer is lower than that in the clad layer.

Further, according to the present invention, a method for manufacturing quantum dots is a method for manufacturing quantum dots used in a semiconductor memory having a floating gate structure, the method including a first step of forming an oxide film on a semiconductor substrate, a second step of forming first quantum dots on the oxide film, a third step of depositing second quantum dot on the first quantum dots, a fourth step of depositing a metal thin film on the second quantum dots, a fifth step of performing heat treatment or remote hydrogen plasma treatment of the second quantum dots and the metal thin films, and a sixth step of depositing third quantum dots on a compound of a semiconductor and a metal, the compound being produced in the fifth step.

Preferably, in the fifth step, the remote hydrogen plasma treatment is performed under a condition in which the semiconductor substrate is electrically floated.

Preferably, in the fourth step, metal thin films having higher electron affinity than that of the semiconductor substrate is deposited on the second quantum dots.

Preferably, the semiconductor substrate is composed of silicon, and the metal thin films include nickel thin films or tungsten thin films.

In the semiconductor memory according to the present invention, each of the quantum dots of the charge storage node includes the core layer inside of the clad layer, the core layer having a lower electron occupied level than that of the clad layer. As a result, the electrons injected into the quantum dots of the charge storage node are confined in the core layers, and the electron holding ability of the charge storage node is enhanced.

According to the present invention, the electron (=information) holding ability of the semiconductor memory can be improved. In addition, the electron holding ability of the charge storage node is enhanced, and consequently the thickness of an insulating film disposed between the semiconductor substrate and the control node can be decreased, thereby realizing high-speed memory write and memory erase.

BRIEF DESCRIPTION OF DRAWINGS

FIG. 12 is a schematic view of a semiconductor memory system using a semiconductor memory according to the present invention.

BEST MODE FOR CARRYING OUT THE INVENTION

Figure 1:
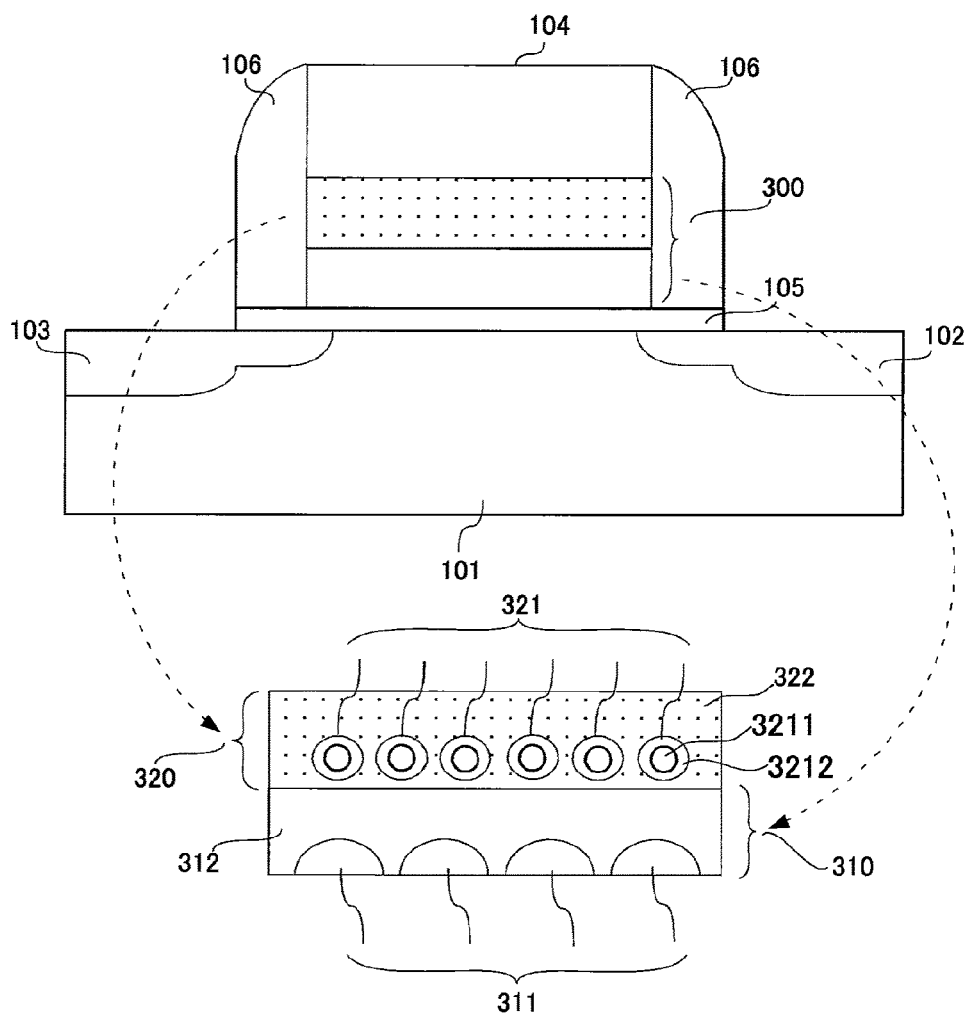
FIG. 1 is a sectional view of a semiconductor memory according to an embodiment of the present invention.

An embodiment of the present invention is described in detail with reference to the drawings. In the drawings, the same portion or corresponding portions are denoted by the same reference numeral, and the description thereof is not repeated.

FIG. 1 is a sectional view of a semiconductor memory according to an embodiment of the present invention. Referring to FIG. 1, a semiconductor memory 100 according to an embodiment of the present invention includes a semiconductor substrate 101, a source electrode 102, a drain electrode 103, an insulating film 105, a composite floating gate 300, a gate electrode 104, and sidewalls 106.

The semiconductor memory 100 has a structure in which the composite floating gate 300 is disposed in a portion held between the insulating film 105 and the gate electrode 104.

The composite floating gate 300 includes a laminate of a control node 310 and a charge storage node 320. The control node 310 is composed of quantum dots 311 and a Si oxide film 312 which covers the quantum dots 311. The charge storage node 320 is composed of quantum dots 321 and a high-dielectric insulating film 322 which covers the quantum dots 321.

Each of the quantum dots 321 includes a core layer 3211 and a clad layer 3212 which covers the core layer 3211. The core layer 3211 is composed of, for example, nickel silicide, and the clad layer 3212 is composed of, for example, Si.

The operation of the semiconductor memory 100 varies depending on a combination of the materials and a combination of the nodes laminated.

The term "quantum dots" represents a quantum structure composed of a conductive material, e.g., a spherical or semi-spherical microcrystal composed of a semiconductor single crystal having such a small size that when a logical value "1" is set in a dot, an increase in electrostatic energy of the dot is larger than 26 meV which is energy at room temperature. When Si is used as the material, the size is typically 10 nm or less. Herein, a film is adapted to cover the quantum dots, and various materials can be selected.

The semiconductor substrate 101 is a n-type single crystal silicon (Si) substrate having plane orientation. The source electrode 102 and the drain electrode 103 are formed on one of the main surfaces of the semiconductor substrate 101. The source electrode 102 and the drain electrode 103 are composed of $p^+$-type Si.

The insulating film 105 is composed of $SiO_2$ and is formed in contact with one of the main surfaces of the semiconductor substrate 101. The insulating film 105 has a thickness of about 2 nm to 4 nm. The thickness of 2 nm to 4 nm permits electrons to tunnel through the insulating film 105.

The composite floating gate 300 is formed in contact with the insulating film 105. The gate electrode 104 is formed in contact with the composite floating gate 300. The gate electrode 104 is composed of an impurity semiconductor or a semitransparent conductor. More specifically, the gate electrode 104 is composed of a pure metal such as tantalum (Ta), aluminum (Al), tungsten (W), molybdenum (Mo), or the like, an alloy thereof, a transparent conductor such as ITO (Indium Tin Oxide), IZO (Indium Zinc Oxide), or the like, or a semiconductor decreased in resistance by doping with a high concentration of impurity.

The sidewalls 106 are insulating films including silicon oxide films and are formed on the insulating film 105 so as to sandwich the composite floating gate 300 and the gate electrode 104 from both sides.

The composite floating gate 300 includes the control node 310 and the charge storage node 320. The control node 310 is formed in contact with the insulating film 105, and the charge storage node 320 is formed in contact with the control node 310. In this way, the composite floating gate 300 has a two-layer structure including the control node 310 and the charge storage node 320 laminated thereon.

The control node 310 is composed of a plurality of quantum dots 311 and the Si oxide film 312. The plurality of quantum dots 311 are two-dimensionally formed on the insulating film 105. Each of the plurality of quantum dots 311 is composed of a substantially semi-spherical Si crystal and has a diameter of 10 nm or less and a height of 7 nm. The Si oxide film 312 is formed to cover the plurality of quantum dots 311.

The charge storage node 320 is composed of a plurality of quantum dots 321 and the high-dielectric insulating film 322.

The plurality of quantum dots 321 are two-dimensionally formed on the Si oxide film 312 of the control node 310. Each of the plurality of quantum dots 321 has an average height of about 6 nm.

The high-dielectric insulating film 322 is formed to cover the plurality of quantum dots 321. The high-dielectric insulating film 322 includes a tantalum oxide film (Ta oxide film) or a zirconium oxide film (Zr oxide film).

The reason for using a Ta oxide film or a Zr oxide film as the high-dielectric insulating film 322 is the following: Electrons can be excited by infrared light, which is widely used for data communication, and injected into the quantum dots. Therefore, it is possible to realize data output from an integrated circuit formed using the semiconductor memory 100 of the present invention through a high-speed communication network.

When a positive voltage is applied to the gate electrode 104, the insulating film 105 passes the electrons in the semiconductor substrate 101 to the quantum dots 311 by tunneling and passes the electrons in the quantum dots 311 to the semiconductor substrate 101 by tunneling.

The control node 310 has the function to control injection of electrons from the semiconductor substrate 101 to the charge storage node 320 and emission of electrons from the charge storage node 320 to the semiconductor substrate 101. The charge storage node 320 has the function to hold the electrons injected from the semiconductor substrate 101 through the control node 310.

Figure 2:
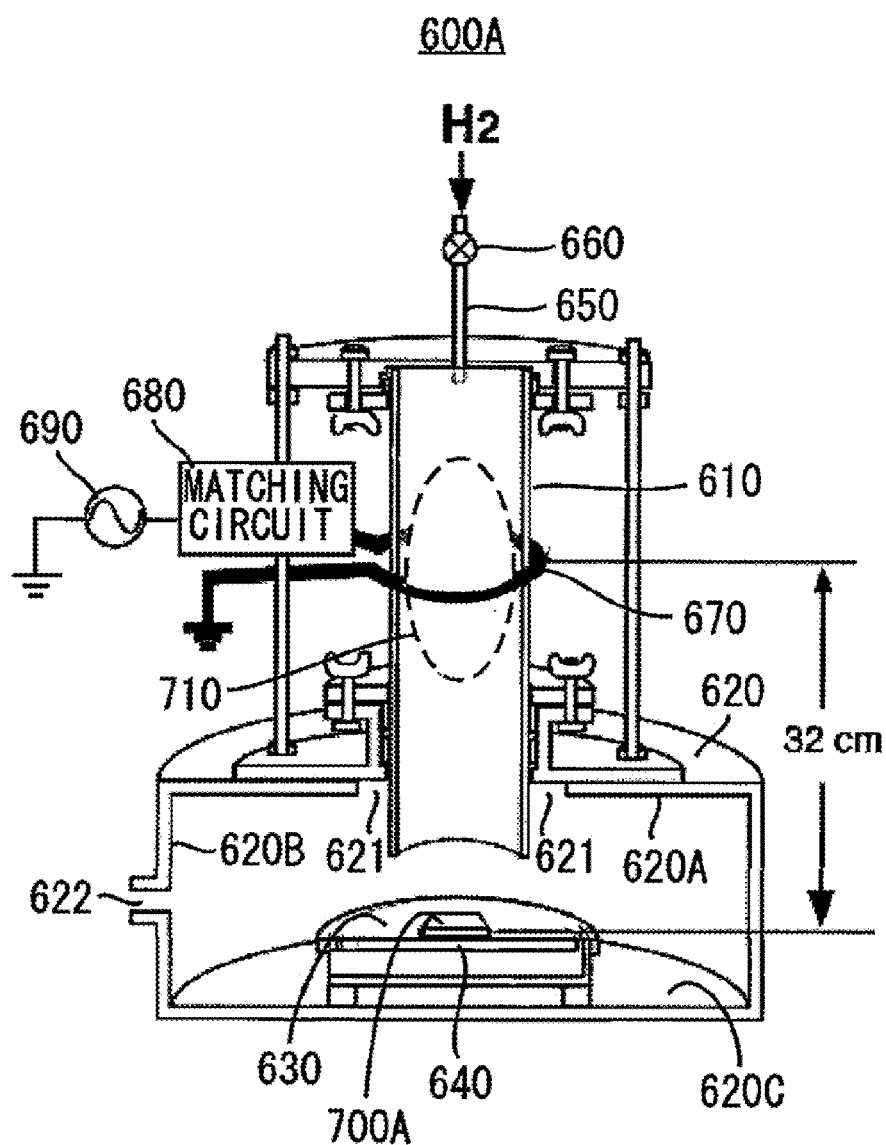
FIG. 2 is a schematic view of a plasma treatment apparatus for remote hydrogen plasma treatment.

FIG. 2 is a schematic view of a plasma treatment apparatus for remote hydrogen plasma treatment. Referring to FIG. 2, a plasma treatment apparatus 600A includes a quartz tube 610, a reaction chamber 620, a substrate holder 630, a heater 640, a pipe 650, a valve 660, an antenna 670, a matching circuit 680, and a high-frequency power source 690.

The quartz tube 610 has a diameter of 10 cm$\phi$ and is fixed so that one end thereof is inserted into the reaction chamber 620. The reaction chamber 620 has a hollow cylindrical shape and has an opening 621 formed in the upper surface 620A so that one of the ends of the quartz tube 610 is inserted therein and an exhaust port 622 formed in the side surface 620B. One of the ends of the quartz tube 610 is inserted into the reaction chamber 620 through the opening 621 so that the inner space of the reaction chamber 620 communicates with the inner space of the quartz tube 610. Therefore, gases in the reaction chamber 620 and the quartz tube 610 can be exhausted through the exhaust port 622 with a pump (not shown).

The substrate holder 630 is disposed on the bottom 620C of the reaction chamber 620. The heater 640 is composed of silicon carbide (SiC) and disposed in the substrate holder 630.

The pipe 650 is connected to the other end of the quartz tube 610 through the valve 660. The valve 660 is attached to the pipe 650. The antenna 670 is disposed at a position of 32 cm from a substrate 700A placed on the substrate holder 630 so as to surround the quartz tube 610. One of the ends of the antenna 670 is connected to the matching circuit 680, and the other end is grounded.

The matching circuit 680 is connected between one of the ends of the antenna 670 and the high-frequency power source 690. The high-frequency power source 690 is connected between the matching circuit 680 and a ground node.

The heater 640 heats the substrate 700A to a predetermined temperature through the substrate holder 630. The pipes 650 leads hydrogen ($H_2$) gas from a cylinder (not shown) to the quartz tube 610. The valve 660 supplies $H_2$ gas to the quartz tube 610 or cuts off the supply of $H_2$ gas into the quartz tube 610.

The matching circuit 680 decreases reflection of high-frequency power supplied from the high-frequency power source 690 to the high-frequency power source 690 side and supplies high-frequency power to the antenna 670. The high-frequency power source 690 supplies the high-frequency power of 60 MHz to the antenna 670 through the matching circuit 680.

A treatment operation in the plasma treatment apparatus 600A is described. The substrate 700A is placed on the substrate holder 630, and the reaction chamber 620 and the quartz tube 610 are vacuumed through the exhaust port 622.

Then, the valve 660 is opened and a predetermined amount of $H_2$ gas is introduced into the quartz tube 610 from the cylinder (not shown) through the pipe 650. When the pressure in the quartz tube 610 reaches a predetermined pressure, the high-frequency power source 690 supplies high-frequency power of 60 MHz to the antenna 670 through the matching circuit 680. In this case, the matching circuit 680 is controlled to minimize reflection of the high-frequency power supplied from the high-frequency power source 690 toward the high-frequency power source 690 side.

As a result, plasma 710 is produced in the quartz tube 610, and mainly atomic hydrogen diffuses in the quartz tube 610 from the region where the plasma 710 is generated toward the substrate 700A and reaches the surface of the substrate 700A. Then, the surface of the substrate 700A is treated with the atomic hydrogen.

After a predetermined time has passed, the high-frequency power source 690 is turned off, the valve 660 is closed, and the treatment operation is completed.

Figure 3:
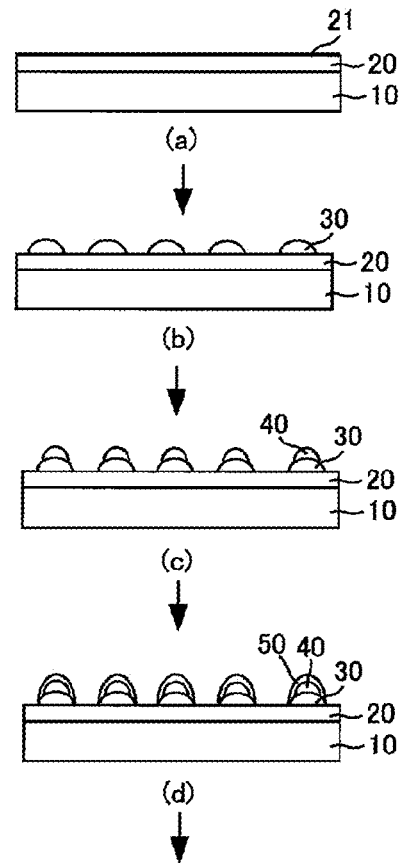
FIG. 3 is a process drawing for illustrating a method for manufacturing quantum dots using the plasma treatment apparatus shown in FIG. 2.
Figure 3:
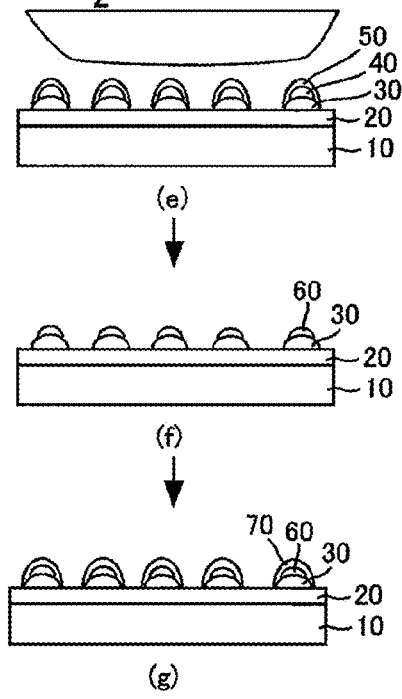

FIG. 3 is a process drawing for illustrating a method for manufacturing quantum dots using the plasma treatment apparatus 600A shown in FIG. 2. Referring to FIG. 3, when manufacture of quantum dots is started, a semiconductor substrate 10 composed of n-type Si is RCA-washed, and a main surface of the semiconductor substrate 10 is oxidized at about 1000° C. in a 2% oxygen atmosphere to form a $SiO_2$ film 20 over the whole of the main surface of the semiconductor substrate 10. Then, the surface of the $SiO_2$ film 20 is washed with 0.1% hydrofluoric acid. As a result, the surface of the $SiO_2$ film 20 is terminated with OH 21 (refer to step (a) in FIG. 3).

Then, quantum dots 30 are formed in a self-assembled manner on the $SiO_2$ film 20 by low pressure chemical vapor deposition (LPCVD) using silane ($SiH_4$) gas as a raw material (refer to step (b) in FIG. 3).

Successively, quantum dots 40 are formed on the quantum dots 30 by LPCVD method using $SiH_4$ gas as a raw material (refer to step (c) in FIG. 3).

Then, nickel (Ni) thin films 50 are formed on the quantum dots 40 (refer to step (d) in FIG. 3). In this case, the Ni thin films 50 have a thickness of 1.8 nm.

Accordingly, the quantum dot 30/quantum dot 40/Ni thin film 50 laminates are set on the substrate holder 630 of the plasma treatment apparatus 600A and subjected to remote hydrogen plasma treatment by the above-described method (refer to step (e) in FIG. 3). In this case, the remote hydrogen plasma treatment is performed under the conditions shown in Table 1.

TABLE 1

| | |
|---|---|
| Frequency | 60 MHz |
| Antenna type | Single-turn antenna |
| Antenna-substrate distance | 32 cm |
| Substrate Temperature | Room temperature |
| VHF electric power | 200 to 500 W |

TABLE 1-continued

| Gas pressure | 1.33 to 79.8 Pa |
|---|---|
| Treatment time | 5 minutes |

As shown in Table 1, the quantum dot 30/quantum dot 40/Ni thin film 50 laminates are subjected to remote hydrogen plasma treatment at room temperature.

When the remote hydrogen plasma treatment for 5 minutes is finished, the quantum dot 40/Ni thin film 50 portions are converted to Ni silicide dots 60, and consequently the Ni silicide dots 60 are formed on the quantum dots 30 (refer to step (f) in FIG. 3).

Then, quantum dots 70 are formed on the Ni silicide dots 60 by the LPCVD method using $SiH_4$ gas as a raw material (refer to step (g) in FIG. 3).

As a result, quantum dots including the Ni silicide dots coated with Si layers are completed. Therefore, the quantum dots 321 shown in FIG. 1 are manufactured according to the steps (a) to (g) shown in FIG. 3.

The quantum dot 40/Ni thin film 50 portions are treated with remote hydrogen plasma under a condition in which the semiconductor substrate 700A is electrically floated. Namely, the quantum dot 40/Ni thin film 50 portions are treated with remote hydrogen plasma under a condition in which damage by various ions produced in the plasma 710 is suppressed. Therefore, the Ni silicide dots 60 can be manufactured.

The method for manufacturing the semiconductor memory 100 is described. A main surface of the semiconductor substrate 101 composed of n-type Si is doped with a high concentration of B to form the source electrode 102 and the drain electrode 103.

Then, the main surface of the semiconductor substrate 101 is oxidized at about 1000° C. in a 2% oxygen atmosphere to form a $SiO_2$ film over the whole of the main surface of the semiconductor substrate 101, and the formed $SiO_2$ film is patterned by photolithography to form the insulating film 105.

Then, the surface of the insulating film 105 is washed with 0.1% hydrofluoric acid. As a result, the surface of the insulating film 105 is terminated with OH. Then, quantum dots 311 are formed in a self-assembled manner on the insulating film 105 by LPCVD method using $SiH_4$ gas as a raw material.

Then, the quantum dots 311 are oxidized in an oxygen atmosphere to form a Si oxide film 312 having a thickness of about 2 nm. Then, quantum dots 321 are formed on the Si oxide film 312 by the above-described method.

Successively, a high-dielectric insulating film 322 is formed on the quantum dots 321, and a gate electrode 104 is formed on the high-dielectric insulating film 322.

Then, the quantum dots 311, the Si oxide film 312, the quantum dots 321, the high-dielectric insulating film 322, and the gate electrode 104 are patterned in predetermined dimensions to form sidewalls 106 on both sides of the quantum dots 311, the Si oxide film 312, the quantum dots 321, the high-dielectric insulating film 322, and the gate electrode 104. As a result, the semiconductor memory 100 is completed.

Since a hafnium oxide ($HfO_2$) film is generally used as the insulating film 105 (J. J. Lee et al., 2003 Symposium on VLSI Technology Digest of Technical Papers (2003) p. 33), defects are present at the interface between the insulating film 105 and the semiconductor substrate 101, and a high-density interface level occurs due to the defects. Therefore, when a device is turned on, carriers are captured, thereby increasing the threshold voltage and decreasing electron field-effect mobility.

However, in the semiconductor memory 100 according to the present invention, as described above, the interface between the insulating film 105 and the semiconductor substrate 101 is made of $SiO_2$ and Si and is thus very clean and has a low interface level. Therefore, the semiconductor memory 100 according to the present invention does not cause the problem of increasing the threshold voltage or decreasing electron field-effect mobility.

Figure 4:
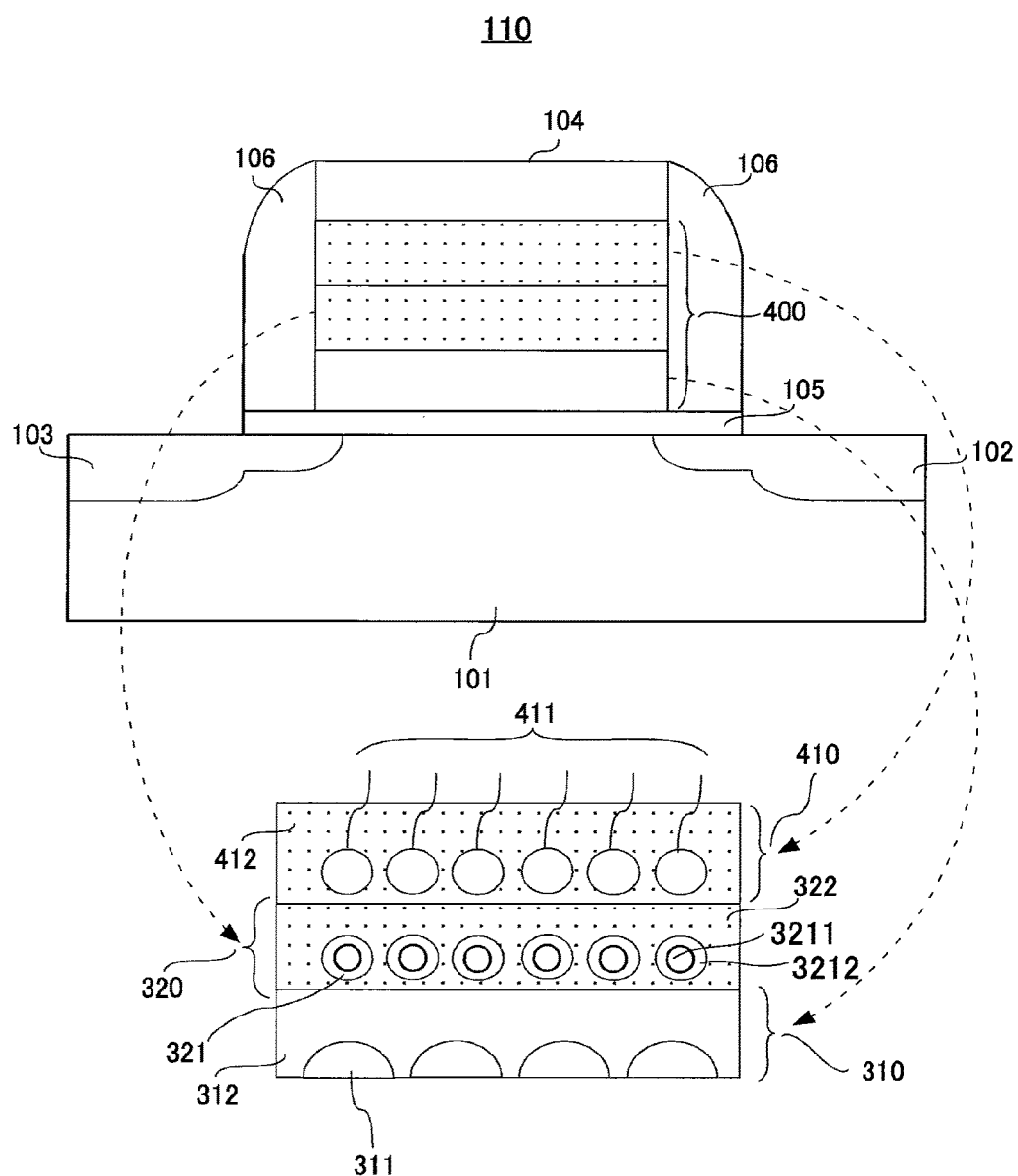
FIG. 4 is a sectional view of an another semiconductor memory according to an embodiment of the present invention.

FIG. 4 is a sectional view of an another semiconductor memory according to an embodiment of the present invention. The semiconductor memory according to the embodiment of the present invention may be a semiconductor memory 110 shown in FIG. 4. Referring to FIG. 4, the semiconductor memory 110 is the same as the semiconductor memory 100 shown in FIG. 1 except that the composite floating gate 300 of the semiconductor memory 100 is replaced by a composite floating gate 400.

The composite floating gate 400 is the same as the composite floating gate 300 shown in FIG. 1 except that a control node 410 is added to the composite floating gate 300.

The control node 410 is formed on the charge storage node 320. Therefore, the composite floating gate 400 has a three-layer structure in which the control node 410 is laminated on the composite floating gate 300 having the two-layer structure. The composite floating gate 400 is disposed between the insulating film 105 and the gate electrode 104.

The control node 410 has the function to control electron emission in memory erase of the semiconductor memory 110. The control node 410 is composed of a plurality of quantum dots 411 and a high-dielectric insulating film 412.

The plurality of quantum dots 411 are two-dimensionally formed on the high-dielectric insulating film 322 of the charge storage node 320. Each of the plurality of quantum dots 411 is composed of a substantially spherical Si crystal and has an average height of 6 nm (may be 10 nm or less). The high-dielectric insulating film 412 is formed to cover the plurality of quantum dots 411. The high-dielectric insulating film 412 includes a Ta oxide film or a Zr oxide film.

The reason why the high-dielectric insulating film 412 includes the Ta oxide film or the Zr oxide film is the same as that for the high-dielectric insulating film 322 including the Ta oxide film or the Zr oxide film.

The method for manufacturing the semiconductor memory 110 is described. In the semiconductor memory 110, the step of forming the quantum dots 411 by the same method as that for the quantum dots 311 and forming the high-dielectric insulating film 412 on the formed quantum dots 411 by the same method as that for the high-dielectric insulating film 322 may be added after the formation of the charge storage node 320 and before the formation of the gate electrode 104 in the method for manufacturing the semiconductor memory 100.

The other parts of the semiconductor memory 110 are the same as those of the semiconductor memory 100.

In FIGS. 1 and 4, the boundary of each node is shown by a substantially horizontal surface for description, but the quantum dots are actually two-dimensionally disposed on the film. Therefore, the boundary between the insulating film 105 and the control node 310 is close to a substantially horizontal surface, but the boundary between the control node 310 and the charge storage node 320 and the boundary between the charge storage node 320 and the control node 410 have irregularity depending on the shape of the quantum dots.

Although described latter, the semiconductor memory 100 or 110 of the present invention performs a write operation by injecting electrons from the semiconductor substrate 101 to the Si-based quantum dots 311 or quantum dots 321 and performs an erase operation by emitting the electrons to the semiconductor substrate 101.

Therefore, even if the high-dielectric insulating film 322 is thick, electron emission is not affected, and the problem of a low erase speed, which occurs in a conventional example (J. J. Lee et al., 2003 Symposium on VLSI Technology Digest of Technical Papers (2003) p. 33), does not occur.

[Operation of Semiconductor Memory]

A memory write operation and memory erase operation in the semiconductor memory 100 or 110 are described.

FIGS. 5 to 10 are first to sixth energy band diagrams for illustrating the memory write operation and memory erase operation in the semiconductor memory 100 or 110.

In the description below, the memory write operation and memory erase operation are described with reference to the energy band diagrams of a transistor capacitor portion in the semiconductor memory 110.

First, the energy band diagram without a positive voltage being applied to the gate electrode 104 of the semiconductor memory 110 is described with reference to FIG. 5. Since the quantum dots 311 of the control node 310 are sandwiched between the insulating film 105 and the Si oxide film 312 and have a nano size, discrete energy levels LV1 are present in the conduction band of the quantum dots 311. Similarly, discrete energy levels LV3 are present in the conduction band of the quantum dots 411.

In addition, the quantum dots 321 have a structure in which the core layer 3211 composed of nickel silicide is covered with the clad layer 3212 composed of Si and thus the core layer 3211 is sandwiched in the clad layer 3212, and thus discrete energy levels LV2 are present in the conduction band of the core layer 3211. In addition, the core layer 3211 and the clad layer 3212 form Schottky junction.

The above-described energy levels LV1 to LV3 are energy levels for electrons. Since the quantum dots 311 are composed of the same Si crystal as the quantum dots 411, the energy levels LV1 are equal to the energy levels LV3. Since the quantum dots 321 are composed of a material different from that of the quantum dots 311 and 411, the energy levels LV2 are lower than the energy levels LV1 and LV3. Further, since the quantum dots 321 are composed of a material different from that of the semiconductor substrate 101, the energy levels LV2 are lower than the conduction band of the semiconductor substrate 101.

As described above, in the semiconductor memory 110, the energy levels LV2 for electrons in the quantum dots 321 of the charge storage node 320 is lower than the energy levels LV1 and LV3 for electrons in the quantum dots 311 and 411 of the control nodes 310 and 410 disposed on both sides of the charge storage node 320.

Therefore, the charge storage node 320 is composed of a different material from that of the control nodes 310 and 410 so that the energy levels LV2 for electrons in the quantum dots 321 is lower than the energy levels LV1 and LV3 for electrons in the quantum dots 311 and 411.

In addition, in each of the quantum dots 321, the core layer 3211 and the clad layer 3212 are composed of materials so as to form Schottky junction in which a barrier is present in the direction from the core layer 3211 to the clad layer 3212.

Figure 5:
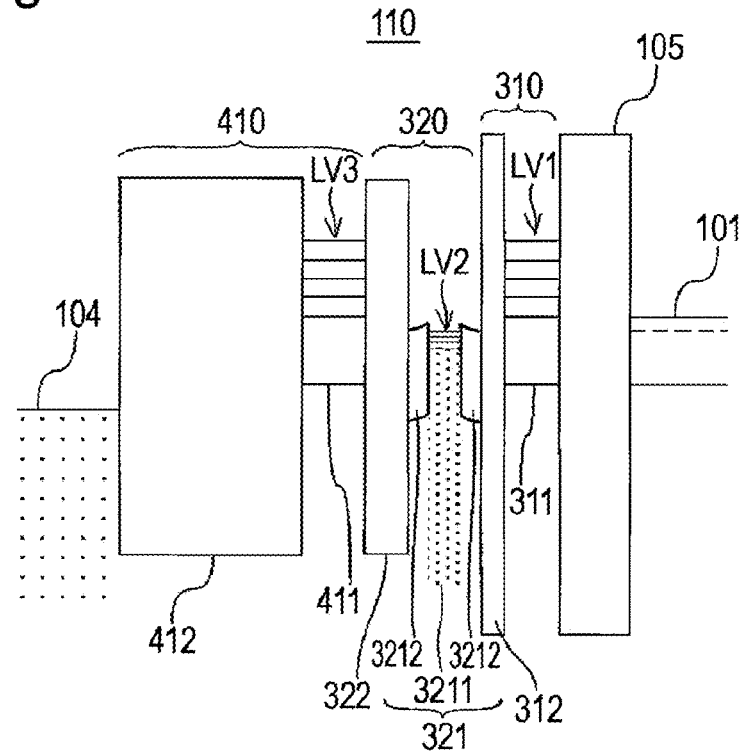
FIG. 5 is a first energy band diagram for illustrating memory write operation and memory erase operation in a semiconductor memory.
Figure 6:
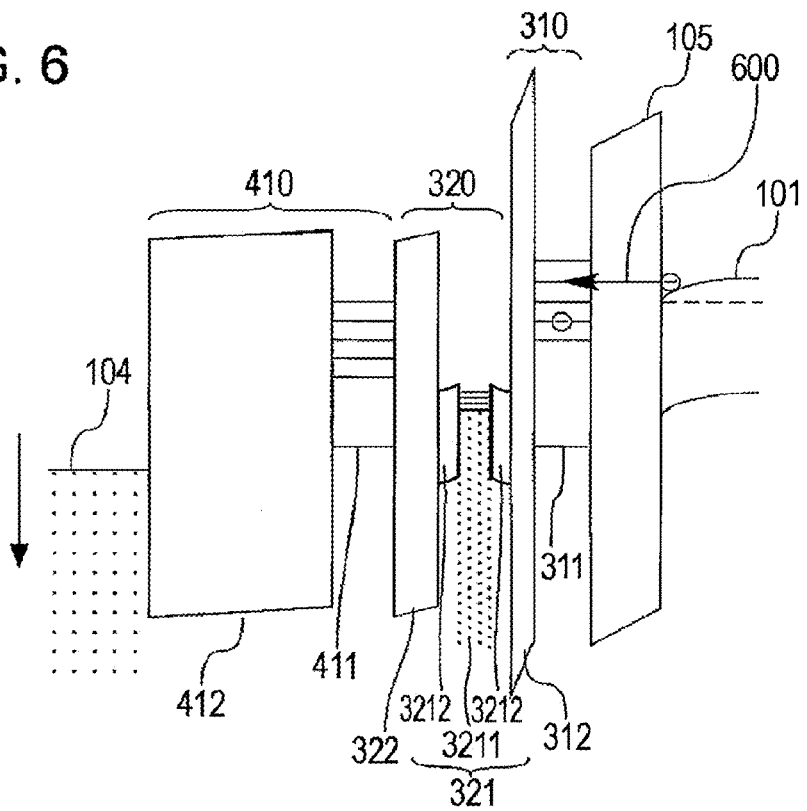
FIG. 6 is a second energy band diagram for illustrating memory write operation and memory erase operation in a semiconductor memory.
Figure 7:
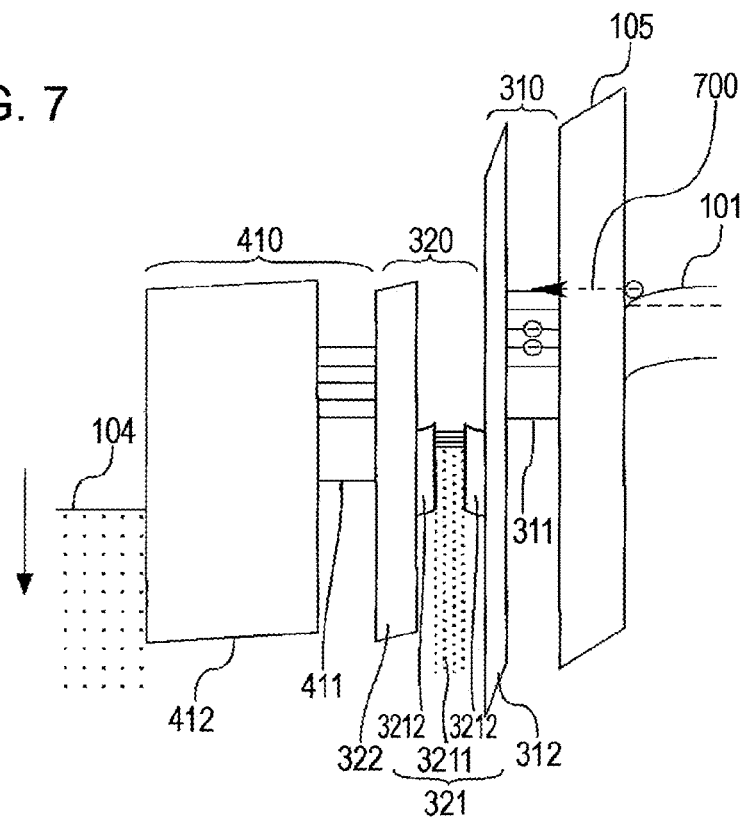
FIG. 7 is a third energy band diagram for illustrating memory write operation and memory erase operation in a semiconductor memory.

Referring to FIG. 6, the memory write operation in the semiconductor memory 110 having the energy band diagram shown in FIG. 5 is performed by applying a positive voltage to the gate electrode 104 and injecting electrons from the semiconductor substrate 101 to the quantum dots 311 and 321.

When a positive voltage is applied to the gate electrode 104, an electron 600 of the semiconductor substrate 101 tunnels through the insulating film 105 and is injected into the quantum dots 311 of the control node 310. When the electron is injected into the quantum dots 311, the electrostatic energy of the quantum dots 311 is increased, and thus the band in the semiconductor substrate 101 is curved downward due to electron holding in the quantum dots 311. This state is determined as logical "1".

When a positive voltage is further applied to the gate electrode 104, an electron of the semiconductor substrate 101 further tunnels through the insulating film 105 and is injected into the quantum dots 311 of the control node 310. Consequently, a second electron 700 is injected into the quantum dots 311 (refer to FIG. 7). This state is determined as logical "2".

As described above, when a positive voltage is applied to the gate electrode 104, electrons 600 of the semiconductor substrate 101 one-by-one tunnel through the insulating film 105 and are injected into the quantum dots 311 of the control node 310. This state permits multi-level expression.

Several electrons injected into the quantum dots 311 are held in the quantum dots 311 during the time when a light input or electron emission operation is not performed.

Figure 8:
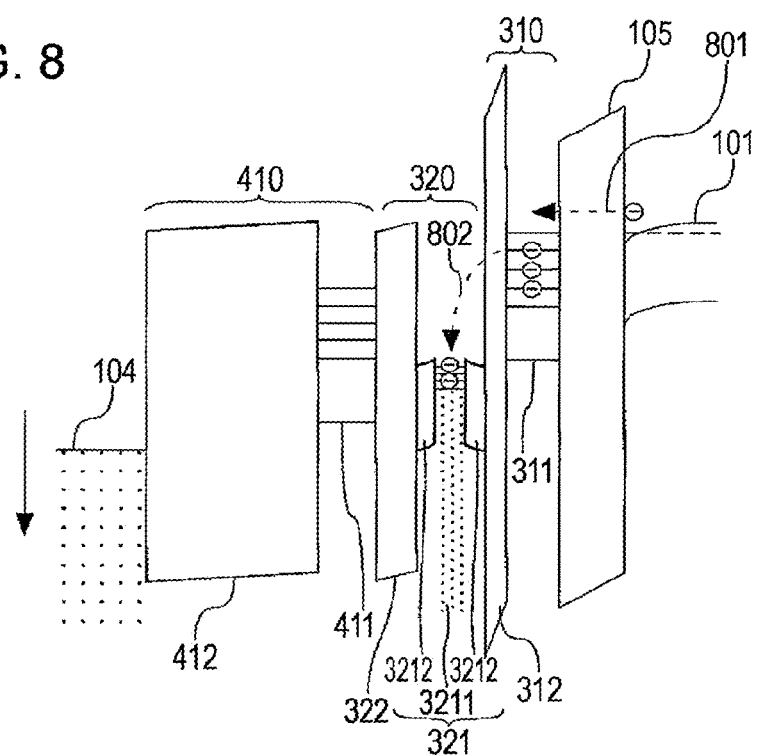
FIG. 8 is a fourth energy band diagram for illustrating memory write operation and memory erase operation in a semiconductor memory.

When a positive voltage is further applied to the gate electrode 104, as described above, an electron 801 is injected from the semiconductor substrate 101 into the quantum dots 311 (refer to FIG. 8). When the amount of the electrons stored in the quantum dots 311 exceeds a predetermined reference, the electrons 802 held in the Si-based quantum dots 311 tunnel through the Si oxide film 312 and are injected to the core layers 3211 of the quantum dots 321 (refer to FIG. 8).

The quantum dots 321 have a nano (quantum) structure, and thus the discrete energy levels LV2 are present. The energy levels LV2 are lower than the energy levels LV1 and LV3 in the quantum dots 311 and 411 of the control node 310 and 410. As a result, in the quantum dots 321, a threshold value shift due to electron holding can be detected, and the number of the electrons held is not limited because a metallic material is used, thereby permitting stable holding of many electrons. Therefore, the electron holding time is increased, resulting in a longer information holding time. Further, since the quantum dots 321 are used for the charge storage node, the insulating film 105 which greatly influences the time required for electron injection, i.e., the information writing time, can be made very thin, and at the same time, the writing speed can be efficiently improved.

On the other hand, the technique disclosed in Japanese Unexamined Patent Application Publication No. 9-260611 or J. J. Lee et al., 2003 Symposium on VLSI Technology Digest of Technical Papers (2003) p. 33 has difficulty in thinning the insulating film 105 for improving the holding time because the charge storage node material is the same as that of the semiconductor substrate 101 from which electrons are emitted. Therefore, it is necessary that the insulating film 105 is set to be relatively thick, and thus it is difficult to reduce the writing time at the same time.

The quantum dots 321 have a structure in which the core layer 3211 is covered with the clad layer 3212, the core layer 3211 is composed of nickel silicide, and the clad layer 3212 is composed of Si. Therefore, a barrier is present in the direction from the core layer 3211 to the clad layer 3212.

As a result, the electrons held at the energy levels LV2 in the core layers 3211 little move to the clad layers 3212.

Therefore, the information holding properties can be more improved as compared with the case in which the quantum dots 321 include Si dots.

In the above-described semiconductor memory 110 according to the present invention, electrons can be efficiently at high speed to the quantum dots 311 and 321 by electric pulses or optical pulses from an impurity semiconductor or a semitransparent metal used as the gate electrode 104.

Further, in the semiconductor memory 110 according to the present invention, the boundary between the insulating film 105 and the semiconductor substrate 101 is a $SiO_2$/Si or $SiO_2$/silicide boundary, and thus good transistor characteristics can be realized without increasing the threshold voltage and decreasing field-effect mobility.

Next, the memory erase operation in the semiconductor memory 110 according to the present invention is described. In the semiconductor memory 110 according to the present invention, memory erase is performed by irradiating the gate electrode 104 with light or applying a negative voltage to the gate electrode 104 to emit the electrons injected into the quantum dots 311 and 321 to the semiconductor substrate 101.

The memory erase operation in the semiconductor memory 110 is described below with reference to FIGS. 9 and 10. Although the present invention includes the structure of the semiconductor memory 100 or the structure of the semiconductor memory 110, description is made on the basis of the structure of the transistor capacitor portion in the structure of the semiconductor memory 110 because there is the same operation step.

When written information is erased, weak light 900 is incident on the gate electrode 104. When the weak light 900 is incident on the gate electrode 104, the electrons held in the quantum dots 321 of the charge storage node 320 are excited by internal photoelectric effect. As a result, in the semiconductor memory 100, the electrons 901 held in the quantum dots 321 are emitted into the quantum dots 311 of the control node 310 (refer to FIG. 9).

Figure 9:
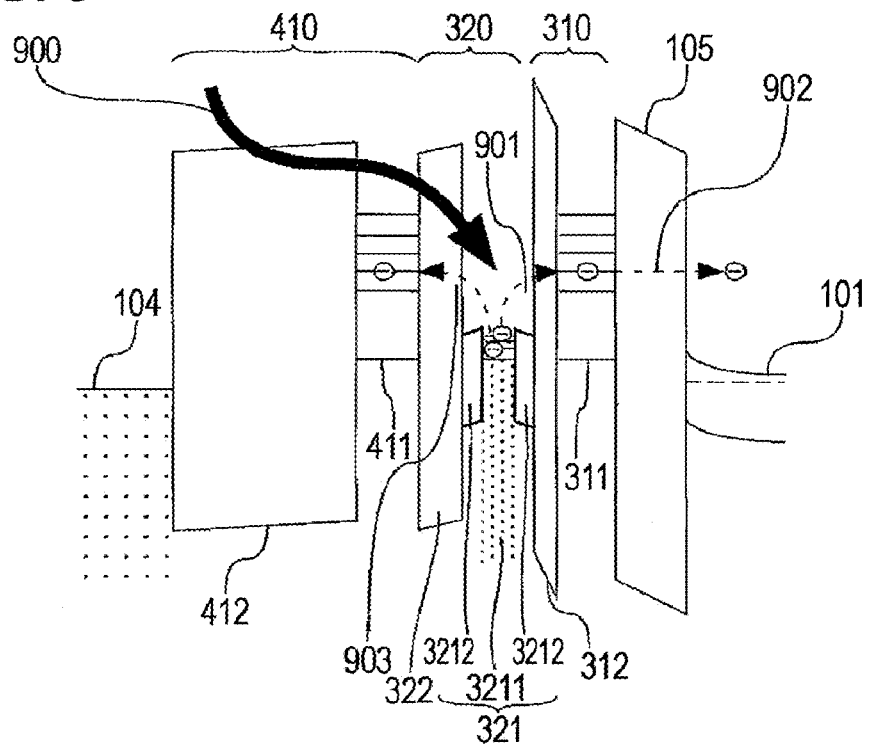
FIG. 9 is a fifth energy band diagram for illustrating memory write operation and memory erase operation in a semiconductor memory.

Then, when a negative voltage is further applied to the gate electrode 104, the electrons 902 in the quantum dots 311 are emitted to the semiconductor substrate 101 (refer to FIG. 9).

In addition, in the semiconductor memory 110, the electrons 901 and 903 held in the quantum dots 321 are separated and emitted into the quantum dots 311 of the control node 310 and into the quantum dots 411 of the control node 410, respectively (refer to FIG. 9).

Then, when a negative voltage is further applied to the gate electrode 104, only the electrons 902 in the quantum dots 311 are emitted to the semiconductor substrate 101 (refer to FIG. 9).

Figure 10:
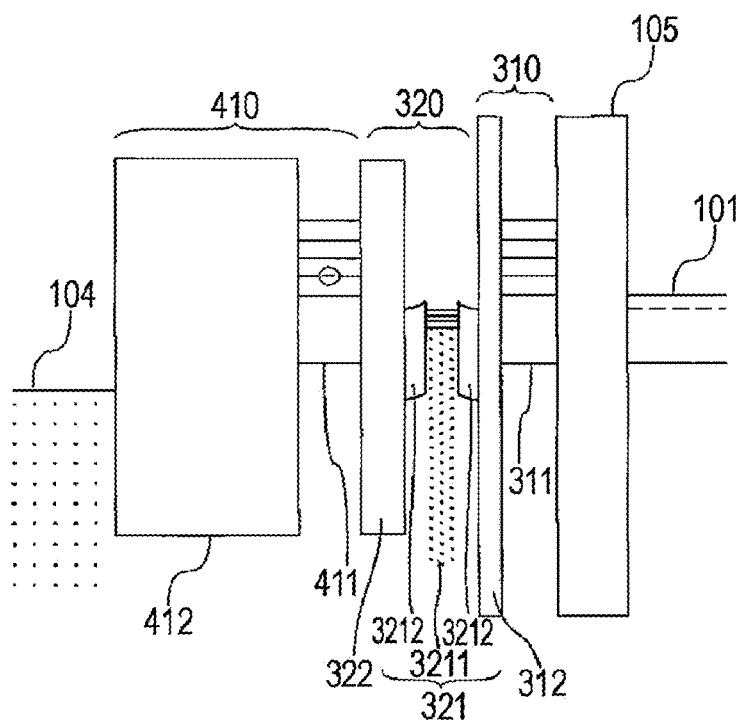
FIG. 10 is a sixth energy band diagram for illustrating memory write operation and memory erase operation in a semiconductor memory.

That is, in the semiconductor memory 110, when the electrons held in the quantum dots 321 of the charge storage node 320 are emitted, the electrons are separated into the quantum dots 311 of the control node 310 and the quantum dots 411 of the control node 410, all held electrons are not emitted at once, but only the electrons emitted into the quantum dots 311 of the control node 310 are emitted under control by the gate voltage (refer to FIG. 10).

As a result, a partial erase operation of multi-level memory can be performed, and thus control of the memory erase operation can be more secured.

When all electrons are emitted at a time, the gate electrode 104 is irradiated with the weak light 900 with a negative voltage applied to the gate electrode 104. Consequently, all the electrons held in the quantum dots 321 can be emitted into the quantum dots 311 of the control node 310 by the internal photoelectric effect. When a voltage is further applied, the electrons held in the quantum dots 311 are emitted to the semiconductor substrate 101, and the held electrons are eliminated, resulting in erase of data.

Since the quantum dots 311 of the control node 310 and the quantum dots 411 of the control node 410 have low barriers to the quantum dots 321, the electrons can be easily emitted even by infrared light. Therefore, the semiconductor memory 110 is advantageous in that data can be output by infrared light which is currently widely used in optical data communication.

A light source of the weak light 900 may be realized by applying an organic EL material to the inside of a memory package.

In a structure in which quantum dots are sandwiched between high-dielectric insulating films in the thickness direction as disclosed in prior art (J. J. Lee et al., 2003 Symposium on VLSI Technology Digest of Technical Papers (2003) p. 33), a gate voltage is equally applied to both high-dielectric insulating films, and a voltage drop in the high-dielectric insulating film disposed on the gate insulating film-side is not negligible. Thus, in order to generate a sufficient electric field in the insulating film 105 (tunnel oxide film) important for electron emission, it is necessary to apply a high gate voltage.

In contrast, in the semiconductor memory 100 or 110 of the present invention, the high-dielectric insulating film (322, 412) is used as the gate insulating film 322, and the Si oxide film 312 and the insulating film 105 (tunnel oxide film) each include a Si oxide film. Therefore, the electric field applied to the high-dielectric insulating film when a negative voltage is applied for emitting electrons is small, and a strong electric field is applied to the insulating film 105 serving as the tunnel oxide film. Thus, the electrons injected into the quantum dots 321 can be effectively emitted to the semiconductor substrate 101 at a relatively low gate voltage within a short time. Since electron migration in the composite floating gate (300, 400) is utilized, the problem of decreasing the erase speed, which occurs in use of a $HfO_2$ film as disclosed in J. J. Lee et al., 2003 Symposium on VLSI Technology Digest of Technical Papers (2003) p. 33, does not occur, and high-speed optical response can be expected. Therefore, high-speed memory erase can be realized.

In the semiconductor memory 100 or 110 according to the present invention, multi-level memory operation can be realized by using the above-described composite floating gate (300, 400) and electron injection and emission means.

In addition, when electrons are injected into silicide quantum dots which can realize a deeper potential well for electrons as compared with Si-based quantum dots, the electrons injected can be stably stored in the silicide quantum dots, and thus the electrons are hardly emitted. As a result, a decrease in write/erase time due to thinning of the insulating film 105 can be improved, thereby realizing stable high-speed multi-level memory operation.

Figure 11:
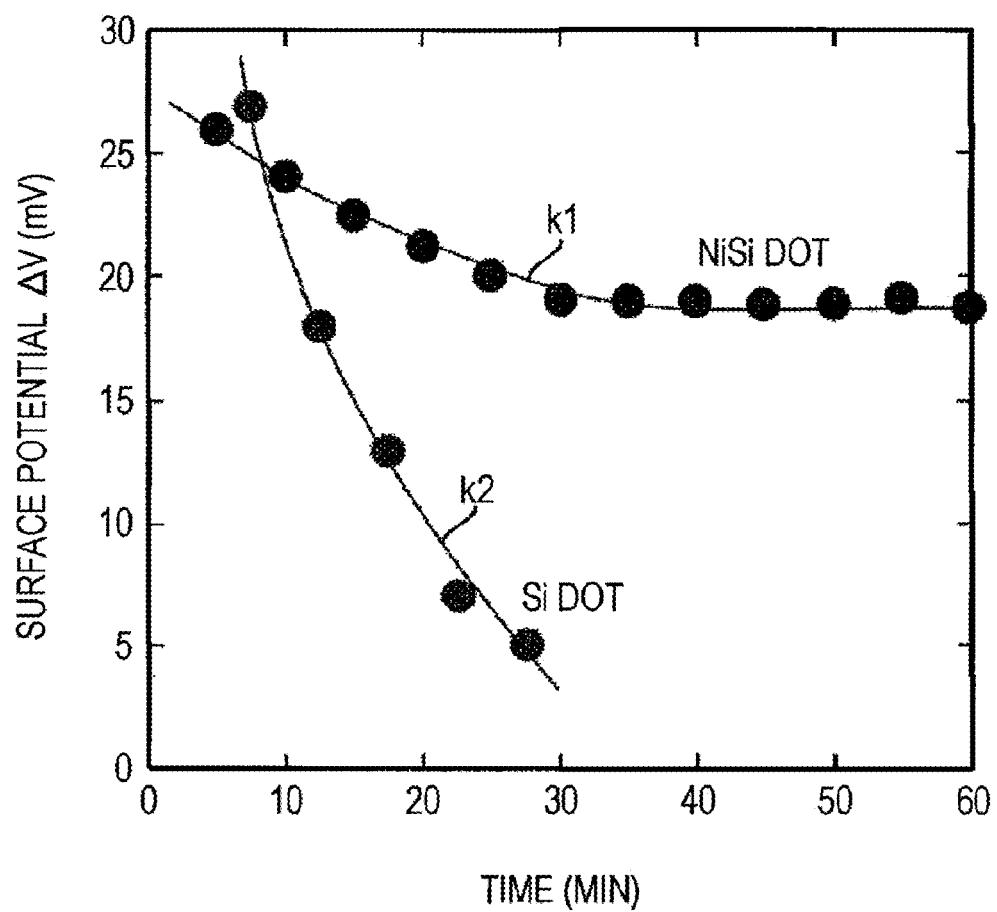
FIG. 11 is a graph showing a relationship between surface potential and time.

FIG. 11 is a graph showing a relationship between surface potential and time. In FIG. 11, the surface potential is shown on ordinate, and the time is shown on abscissa. In addition, curve k1 shows the surface potential of a quantum dot composed of nickel silicide (NiSi), and curve k2 shows the surface potential of a quantum dot composed of Si.

Referring to FIG. 11, the surface potential of a quantum dot composed of NiSi decreases with the passage of time and is saturated at about 20 mV after about 30 minutes (refer to the curve k1).

On the other hand, the surface potential of a quantum dot composed of Si rapidly decreases with the passage of time and decreases to 5 mV after about 30 minutes (refer to the curve k2).

Therefore, a quantum dot composed of NiSi has good surface potential holding properties as compared with a quantum dot composed of Si.

The semiconductor memory 100 or 110 uses the quantum dots 321 for the charge storage node 320, the quantum dots 321 each including the core layer 3211 composed of NiSi and the clad layer 3212, which covers the core layer 3211, composed of Si. Therefore, the electron (information) holding properties in the semiconductor memory 100 or 110 can be improved due to the good surface potential holding properties of quantum dots composed of NiSi and the presence of Schottky junction in which a barrier is present in the direction from the core layer 3211 to the clad layer 3212 in the quantum dots 321.

Application Example

FIG. 12 is a schematic view of a semiconductor memory system using a semiconductor memory according to the present invention. Referring to FIG. 12, a semiconductor memory system 800 includes a semiconductor memory 110 and a light source 810.

In the semiconductor memory system 800, the gate electrode 104 of the semiconductor memory 110 includes a transmissive gate electrode made of ITO or IZO.

The light source 810 irradiates the semiconductor memory 110 with the weak light 900 from the gate electrode 104 side. As a result, the electrons held in the charge storage node 320 of the semiconductor memory 110 are excited and emitted to the control node 410 or the semiconductor substrate 101, thereby performing memory erase in the semiconductor memory 110.

In the semiconductor memory system 800, the semiconductor memory 100 may be used in place of the semiconductor memory 110. In this case, the gate electrode 104 includes a transmissive gate electrode made of ITO or ZnO.

Although it is described above that the semiconductor substrate 101 is a n-type single crystal Si substrate, in the present invention, the semiconductor substrate 101 is not limited to this and may include any one of a single crystal semiconductor substrate, a compound semiconductor substrate, a single crystal semiconductor thin film formed on an insulator (SOI: Silicon On Insulator), a compound semiconductor thin film, a polycrystalline semiconductor formed on an insulator, a polycrystalline compound semiconductor thin film, and the like.

Although it is described above that the quantum dots 311 are composed of Si crystal, in the present invention, the quantum dots 311 are not limited to this and may be composed of any one of Ge crystal, Si or Ge crystal doped with phosphorus (P) or boron (B), and a Si-coated Ge core. When P or B is added, helium (He)-diluted 1% phosphine ($PH_3$) or diborane ($B_2H_6$) is pulse-added in a small amount during the formation of the quantum dots 311 by the LPCVD method to form the P- or B-doped quantum dots 311. Details are described in K. Makihara et al., Abst. of IUMRS-ICA-2006 (2006) p. 82. The formation of Si quantum dots each including a Ge core is described in Y. Darma et al., Appl. Surf. Sci., Vol. 224 (2004) pp. 156-159.

Although it is described above that the core layers 3211 of the quantum dots 321 are composed of Ni silicide, in the present invention, the core layers 3211 are not limited to this and may be composed of tungsten (W) silicide, palladium (Pd) silicide, or platinum (Pt) silicide. Generally, the core layers 3211 may be composed of silicide of silicon and a metal having higher electron affinity than that of Si which is a material of the semiconductor substrate 501 or a compound of germanium and a metal having higher electron affinity than that of Si which is a material of the semiconductor substrate 501.

Further, the electron occupied level in the core layers 3211 may be lower than that in the clad layers 3212. This is because when the electron occupied level in the core layers 3211 is lower than that in the clad layers 3212, the electron holding properties are improved.

Although it is described above that the clad layers 3212 of the quantum dots 321 are composed of Si, in the present invention, the clad layers 3212 are not limited to this and may be composed of germanium or silicon germanium.

Although it is described above that the quantum dot 40/Ni thin film 50 portions are subjected to remote hydrogen plasma treatment to form the Ni silicide dots 60, in the present invention, the Ni silicide dots 60 are not limited to this and may be formed by heating the quantum dot 40/Ni thin film 50 portions.

When the Ni silicide dots 60 are formed by heating the quantum dot 40/Ni thin film 50 portions, the Ni silicide dots 60 are composed of Ni-rich Ni silicide having a Ni/Si ratio higher than that of NiSi. When the Ni silicide dots 60 are formed by remote hydrogen plasma treatment of the quantum dot 40/Ni thin film 50 portions, the Ni silicide dots 60 are composed of NiSi having a Ni/Si ratio of 1:1.

Although it is described above that the high-dielectric insulating film 322 and the high-dielectric insulating film 412 each include the Ta oxide film or the Zr oxide film, in the present invention, the high-dielectric insulating film 322 and the high-dielectric insulating film 412 are not limited to this and may include any one of an aluminum oxide film (Al oxide film), an yttrium oxide film (Y oxide film), a hafnium oxide film (Hf oxide film), and a lanthanum oxide film (La oxide film).

In the present invention, the quantum dots 321 constitute first quantum dots, and the quantum dots 311 constitute second quantum dots.

In the present invention, the high-dielectric insulating film 322 constitutes a first coating material, and the Si oxide film 312 constitutes a second coating material.

In the present invention, the control node 310 constitutes a first control node, and the control node 410 constitutes a second control node.

Further, in the present invention, the quantum dots 30 constitute first quantum dots, the quantum dots 40 constitute second quantum dots, the Ni thin films 50 constitute metal thin films, and the quantum dots 70 constitute third quantum dots.

It should be considered that the embodiments disclosed herein are illustrative and not restrictive in all aspects. The scope of the present invention is indicated by the claims, not the description of embodiments, and is intended to include meanings equivalent to those in the claims and modifications within the scope.

INDUSTRIAL APPLICABILITY

The present invention is applied to a semiconductor memory having a composite floating gate structure capable of improving information holding properties. The present invention is also applied to a semiconductor memory system using a semiconductor memory having a composite floating gate structure capable of improving information holding properties. Further, the present invention is applied to a method for manufacturing quantum dots used in a semiconductor memory having a composite floating gate structure capable of improving information holding properties.

The invention claimed is:

1. A semiconductor memory having a floating gate structure, comprising:
a charge storage node including first quantum dots and storing electrons; and
a control node including second quantum dots, injecting electrons to the charge storage node and emitting the electron from the charge storage node;
wherein each of the first quantum dots includes a core layer and a clad layer which covers the core layer; and
the electron occupied level in the core layer is lower than that in the clad layer.

2. The semiconductor memory according to claim 1, wherein the control node includes first and second control nodes, and the charge storage node is laminated between the first and second control nodes.

3. The semiconductor memory according to claim 2,
wherein the charge storage node includes the first quantum dots and a first coating material which covers the first quantum dots;
the control node includes the second quantum dots and a second coating material which covers the second quantum dots;
the first quantum dots are composed of a material different from that of the second quantum dots; and
the first coating material is different from the second coating material.

4. The semiconductor memory according to claim 3,
wherein the core layer of each of the first quantum dots is composed of a compound of a metal and a semiconductor;
the clad layer of each of the first quantum dots is composed of a semiconductor; and
the second quantum dots are composed of a metal silicide.

5. The semiconductor memory according to claim 4,
wherein the core layer is composed of a metal silicide of silicon and a metal; and
the clad layer is composed of silicon.

6. The semiconductor memory according to claim 5, wherein the metal is nickel or tungsten.

7. The semiconductor memory according to claim 4,
wherein the core layer is composed of a compound of germanium and a metal; and
the clad layer is composed of germanium.

8. The semiconductor memory according to claim 7, wherein the metal is nickel or tungsten.

9. The semiconductor memory according to claim 1,
wherein the charge storage node includes the first quantum dots and a first coating material which covers the first quantum dots;
the control node includes the second quantum dots and a second coating material which covers the second quantum dots;
the first quantum dots are composed of a material different from that of the second quantum dots; and
the first coating material is different from the second coating material.

10. A semiconductor memory system comprising:
a semiconductor memory having a floating gate structure; and
a light source irradiating to the semiconductor memory with light;
wherein the semiconductor memory includes:
a floating gate including a charge storage node which includes first quantum dots and stores electrons and a control node which includes second quantum dots and injects electrons to the charge storage node and emits the electron from the charge storage node; and
a transmissive gate electrode leading light emitted from the light source to the charge storage node;
the first quantum dots each include a core layer and a clad layer which covers the core layer; and
the electron occupied level in the core layer is lower than that in the clad layer.

11. A method for manufacturing quantum dots used in a semiconductor memory having a floating gate structure, the method comprising:
a first step of forming an oxide film on a semiconductor substrate;
a second step of forming first quantum dots on the oxide film;
a third step of depositing second quantum dots on the first quantum dots;
a fourth step of depositing a metal thin film on the second quantum dots;
a fifth step of performing heat treatment or remote hydrogen plasma treatment of the second quantum dots and the metal thin films; and
a sixth step of depositing third quantum dots on a compound of the second quantum dots and the metal thin film, the compound being produced in the fifth step;
wherein the electron occupied level in the compound is lower than that in the first and third quantum dots.

12. The method for manufacturing quantum dots according to claim 11, wherein in the fifth step, the remote hydrogen plasma treatment is performed under a condition in which the semiconductor substrate is electrically floated.

13. The method for manufacturing quantum dots according to claim 11, wherein in the fourth step, metal thin films having larger electron affinity than that of the semiconductor substrate are deposited on the second quantum dots.

14. The method for manufacturing quantum dots according to claim 13, wherein the semiconductor substrate is composed of silicon; and the metal thin films include nickel thin films or tungsten thin films.

* * * * *